(12) United States Patent
Bonar et al.

(10) Patent No.: US 10,285,310 B2
(45) Date of Patent: May 7, 2019

(54) COMPUTER DATA CENTER COOLING AND ELECTRICITY GENERATION USING RECOVERED HEAT

(71) Applicants: Robert Bonar, Orinda, CA (US);
Henry B Bonar, II, Jacksonville, FL (US)

(72) Inventors: Robert Bonar, Orinda, CA (US);
Henry B Bonar, II, Jacksonville, FL (US)

( * ) Notice: Subject to any disclaimer, the term of this patent is extended or adjusted under 35 U.S.C. 154(b) by 165 days.

(21) Appl. No.: 15/463,709

(22) Filed: Mar. 20, 2017

(65) Prior Publication Data
US 2017/0273221 A1 Sep. 21, 2017

Related U.S. Application Data

(60) Provisional application No. 62/310,776, filed on Mar. 20, 2016.

(51) Int. Cl.
| | |
|---|---|
| F01K 25/08 | (2006.01) |
| H05K 7/20 | (2006.01) |
| F25B 11/04 | (2006.01) |
| F25B 49/02 | (2006.01) |

(52) U.S. Cl.
CPC .......... *H05K 7/20745* (2013.01); *F25B 11/04* (2013.01); *F25B 49/02* (2013.01); *H05K 7/20827* (2013.01); *F25B 2400/141* (2013.01)

(58) Field of Classification Search
CPC ................ F25B 29/003; F25B 2400/14; F25B 2400/141; H05K 7/20718; H05K 7/20745; H05K 7/20754
See application file for complete search history.

(56) References Cited

U.S. PATENT DOCUMENTS

| | | | | |
|---|---|---|---|---|
| 4,214,170 | A * | 7/1980 | Leonard | F01K 17/005 |
| | | | | 290/1 R |
| 6,006,538 | A * | 12/1999 | Prueitt | F01K 25/08 |
| | | | | 62/305 |
| 8,522,569 | B2 | 9/2013 | Avery et al. | |
| 8,904,791 | B2 | 12/2014 | Lehar et al. | |
| 9,057,265 | B2 | 6/2015 | Frazier et al. | |

(Continued)

FOREIGN PATENT DOCUMENTS

CA    2830815 A1    10/2012

*Primary Examiner* — Jonathan R Matthias
(74) *Attorney, Agent, or Firm* — Chhabra Law Firm, PC

(57) ABSTRACT

Using various embodiments, methods and systems for cooling a data center using recovered thermal energy are described. In one embodiment, a data center cooling system comprises a first channel conveying a cooling fluid received from an outlet of a ventilation system of the computer data center at a first temperature, a second channel conveying the cooling fluid provided into an inlet of the ventilation system to cool the data center at a second temperature, and a heat transfer subsystem (HTS) configured to operate in an organic Rankine cycle (ORC) or a gas compression cycle (GCC) to change the temperature of the cooling fluid from the first temperature to the second temperature. In another embodiment, the system includes a monitoring subsystem monitoring a temperature, pressure, or flow of a working-fluid of the HTS and a controller subsystem to determine whether to operate the HTS in the ORC or GCC modes.

16 Claims, 9 Drawing Sheets

(56) References Cited

U.S. PATENT DOCUMENTS

| | | | |
|---|---|---|---|
| 2005/0103465 A1* | 5/2005 | Brasz | F01K 25/08 |
| | | | 165/61 |
| 2006/0225421 A1* | 10/2006 | Yamanaka | F02G 5/00 |
| | | | 60/645 |
| 2014/0060050 A1 | 3/2014 | Kosamana et al. | |
| 2018/0087786 A1* | 3/2018 | Williams | F24F 5/0035 |
| 2018/0119578 A1* | 5/2018 | Zhou | F01K 15/02 |

* cited by examiner

COMPUTER DATA CENTER COOLING AND ELECTRICITY GENERATION USING RECOVERED HEAT

CROSS-REFERENCE TO RELATED PATENT APPLICATIONS

The present application claims priority from U.S. Provisional Patent Application No. 62/310,776 filed on Mar. 20, 2016, titled "Rankine/Carnot Bidirectional Rotary System," the contents of which are incorporated herein by reference.

FIELD OF THE INVENTION

Embodiments of the present invention generally relates to recovering thermal energy. More particularly, embodiments of the invention relate to recovering thermal energy dissipated from a computer data center and/or other sources to cool a computer data center and optionally generate electricity.

BACKGROUND OF THE INVENTION

Computer data centers (data centers), comprise computer servers in a high density setting that expend a significant amount of electricity, resulting in the generation of a significant amount of heat. Data centers, also referred to as server farms, can range in size from that of a small room to a facility with hundreds of thousands of square feet of space for the housing of tens of thousands of computer servers and related infrastructure. The computer servers in a data center run constantly and require certain redundancy of supporting power and cooling infrastructure. Computer servers, and other electronic equipment in a data center, consume a lot of electricity which results in generation of waste heat. Heat, if not removed, can result in overheating and equipment failure, and thus to maintain their operational requirements a ventilation system is employed in which cool air (or other data center cooling fluid) is circulated through the server's electronic equipment, removing the excess heat.

As data centers have become larger in the last few years, electrical efficiency of the data center has become increasingly important. Data centers that have been built with a power requirement of over 30 mega-watts. Computer servers typically consume the bulk of the power load with most of the remaining consumption being related to the cooling equipment needed to remove the waste heat from the data center.

As the need for computing power grows, super data centers have emerged spanning across multiple data centers to provide cloud based computing platforms by providing shared computer processing resources to computers and other devices on demand. Consequently, the need of data centers, for both private and public based cloud computing has continued to increase. However, the data center dissipated heat is generally released to the environment, thus wasting the thermal energy carried within. Therefore, what is needed are systems, devices, methods, and techniques that improve the efficiency of a data center by recovering and utilizing wasted thermal energy dissipated from a data center and/or other sources.

SUMMARY OF THE DESCRIPTION

Using various embodiments, systems, methods, and techniques are described to cool a computer data center utilizing recovered thermal energy. In one embodiment, a first channel is configured to convey a data center cooling fluid (e.g., air, water, etc.) received from an outlet of a ventilation system of the computer data center at a first temperature and a second channel configured to convey the data center cooling fluid into an inlet of the ventilation system of the computer data center to cool the computer data center at a second temperature, the first temperature is higher than the second temperature. The system, in one embodiment, includes a heat transfer subsystem coupled to the first and second channel, configured to operate in one of an organic Rankine cycle (ORC) or a gas compression cycle (GCC), where the heat transfer subsystem changes temperature of the data center cooling fluid from the first temperature to the second temperature, the first temperature higher than the second temperature.

In an alternative embodiment, the heat transfer subsystem includes a closed loop circulation subsystem (CLCS) comprising at least one dual mode expander-compressor unit, a condenser unit, a receiver unit, a circulating pump unit, and a boiler unit, configured to operate in one of an organic Rankine cycle (ORC) mode or a gas compression cycle (GCC) mode, in which a working-fluid within the CLCS is heated by the data center cooling fluid from the first channel, at the boiler unit, changing the temperature of the data center cooling fluid from the first temperature to the second temperature. In this embodiment, the CLCS is coupled to the first and second channels via the boiler unit. In one embodiment, the CLCS further comprises a heat exchanger unit that is coupled to a third channel configured to convey a coolant (e.g., waste heated water) from another heat source (e.g., power plant) having a third temperature that is higher than the first and second temperatures, and wherein the heat exchange unit is operable when the CLCS operates the system in the ORC mode.

In one embodiment, when the dual mode expander-compressor unit is configured to operate as a compressor, the CLCS is configured to operate the GCC. In another embodiment, when the dual mode expander-compressor unit is configured to operate as an expander, the CLCS is configured to operate the ORC. In yet another embodiment, the working-fluid interacts with the expander to generate electricity. In one embodiment, the circulating pump unit is inoperable when the CLCS operates in the GCC mode. In one embodiment, the working-fluid can be an organic substance with a high molecular mass. In yet another embodiment, the data center cooling fluid is one of air, water, or an organic matter from where thermal energy is collected from the data center cooling fluid in the first channel, at the boiler unit, to transform the working-fluid into a gaseous state. The working fluid in the gaseous state drives the expander in production of mechanical energy to generate electricity, with working fluid from the expander condensed back into liquid form by the condenser for reuse within the ORC.

In another embodiment, the system further includes a monitoring subsystem including sensors to monitor ambient conditions, including at least one of temperature, pressure, or flow of the working-fluid at one or more locations within the CLCS, the monitoring subsystem providing sensor data related to the at least one of temperature, pressure, or flow of the working-fluid based on the environmental/ambient conditions. The system can further include a controller subsystem to receiving sensor data from the monitoring subsystem. In one embodiment the controller subsystem regulates operation of the system based on the sensor data to determine the mode of operation of the system based on ambient conditions. The controller subsystem, in one embodiment, based on sensor data, can determine whether to run the ORC mode or GCC mode.

BRIEF DESCRIPTION OF THE DRAWINGS

The present invention is illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" or "another embodiment" means that a particular feature, structure, or characteristic described in conjunction with the embodiment can be included in at least one embodiment of the invention. The appearances of the phrase "in one embodiment" in various places in the specification do not necessarily all refer to the same embodiment. The processes depicted in the figures that follow are performed by processing logic that comprises hardware (e.g., circuitry, dedicated logic, etc.), software, or a combination of both. Although the processes are described below in terms of some sequential operations, it should be appreciated that some of the operations described can be performed in a different order. Moreover, some operations can be performed in parallel rather than sequentially.

Using various embodiments, the invention described herein provides systems, methods, and techniques to cool a data center by recovering waste heat from the data center, and optionally generate electricity. In one embodiment, the electricity generated by such systems can be used to provide electrical power to computer server(s) of the data center and other electrical equipment, thereby reducing overall electrical energy consumption of the data center.

Figure 1:
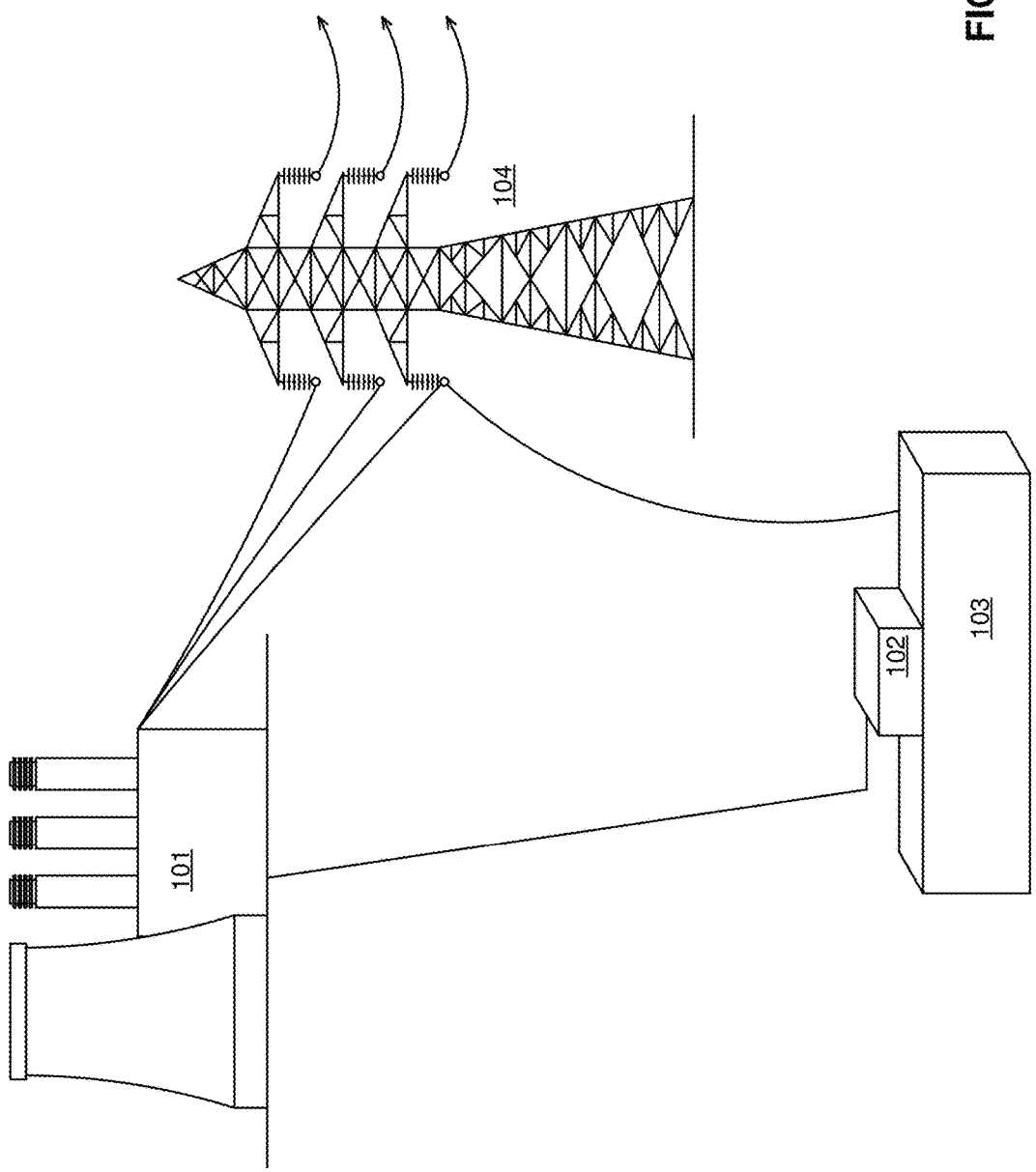
FIG. 1 illustrates a diagram of an overview describing a system implemented according to one embodiment of the invention.

FIG. 1 illustrates a diagram of an overview describing a system implemented according to one embodiment of the invention. As illustrated, data center 103 is coupled to system 102 of an embodiment of the present invention. System 102 provides an efficient cooling system to prevent data center 103 from overheating. In one embodiment, system 102 provides a dual mode operation of a gas-compression cycle (GCC), which is a traditional air conditioning system cycle, and an organic Rankine cycle (ORC), using a working fluid in a closed loop system.

In the ORC mode of operation, system 102 uses thermodynamic processes in which a working fluid is circulated in a closed loop (or cycle) to gather heat from a heat source to generate power by expanding the working fluid into a hot gas through an expander or turbine. The expanded gas is condensed in a condenser by transferring heat to a cold thermal reservoir. It is then compressed/pumped up to a higher pressure to complete the cycle. In the GCC mode of operation, system 102 consumes electricity, like a conventional refrigeration cycle based system, from power grid 104 to cool data center 103. In this mode of operation, the working fluid, in gas form, is compressed by a compressor. The compressed working fluid, in a gaseous phase, enters a condenser where it is cooled and transformed into a liquid. The working fluid, as a high pressure liquid, is disposed through an expansion device to reduce the pressure and temperature of the working fluid. Thereafter, the liquid enters a boiler where it removes heat from a heat source, provided by a ventilation system of data center 103, and the working fluid is turned to a gaseous phase. The cycle is repeated to cool data center 103.

In various embodiments, system 102 can operate in the GCC mode, the ORC mode, or a combination thereof. In one embodiment, system 102 can operate in a combined mode alternating between modes of operation as needed. Such a system requires an expander unit and a compressor unit, or a dual mode expander-compressor unit that can operate as an expander or compressor. In one embodiment, environmental temperature and/or other ambient air conditions determine the mode of operation of system 102. For example, on hot days (e.g., on days when the temperature is more than 75 degrees Fahrenheit), system 102 can operate the GCC mode to operate as a conventional air conditioning system removing hot air from data center 103 and providing cooled air to a ventilation inlet of data center 103. On cooler days, for example, system 102 can utilize waste heat dissipated from data center 103 (and optionally from other sources), to generate electricity, while still cooling data center 103 by taking advantage of the environmental temperature and/or other ambient air conditions. Thus, by providing such a dual mode of operation, the resulting net gain of the efficiency of system 102 can be significant, when compared to existing conventional systems.

Since data centers usually require immense power requirements, in one embodiment, power plant 101 can be constructed nearby data center 103 to meet its power and cooling requirements. In this embodiment, additional heat sources (e.g., where there is a power plant in close proximity, the waste heat from the power plant) can be used as a supplemental heat source to drive the ORC mode and generate electricity by system 102. Therefore, Combined Heat and Power (CHP) plants built near data center 103 can further create significant efficiencies by generating electricity in close proximity to data center 103, and waste heat of power plant 101 can be used as an additional heat source for heating, cooling, or additional power generation of the data center.

Figure 2:
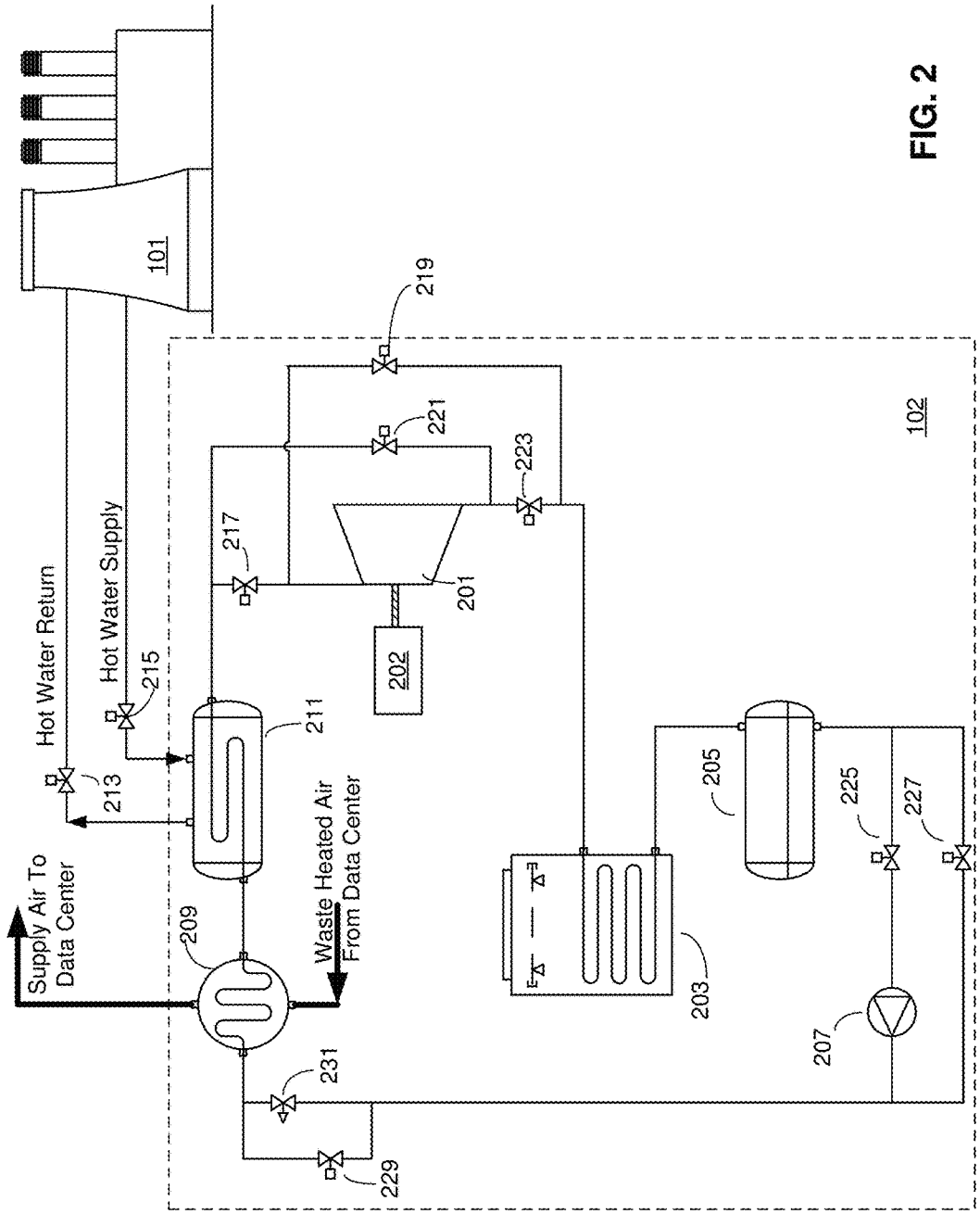
FIG. 2 illustrates a diagram of various components that can be used by a system implemented according to one embodiment of the present invention.

FIG. 2 illustrates a diagram of various components that can be used by a system implemented according to one embodiment of the present invention. As illustrated, system 102 includes a dual mode expander-compressor unit 201 that can receive the working fluid. Various control valves are provided herein and are opened/closed depending on the mode of operation (GCC/ORC) of system 102. The modes of operation and the control valves that are opened/closed are further described in FIGS. 3 and 4, herein. Thus, in one embodiment dual mode expander-compressor unit can receive the working fluid via control valves 217 or 221 depending on the mode of operation. Thereafter, the working fluid is transferred to condenser 203, where it is cooled, via control valves 219 or 223, depending on its mode of operation. Receiver 205 receives the cooled working fluid from where it is transported to pump 207 from control valve 225 in the ORC mode, or to control valve 227 in the GCC mode. The working fluid is then transported to boiler 209 via control valve 229 or control valve 231, depending on the mode of operation as further described herein. At boiler 209 thermal energy from data center cooling fluid (e.g., air, water, etc.) received from an outlet channel of a ventilation system of data center 103 is transmitted to the working fluid, thereby cooling the data center cooling fluid, and heating the working fluid of system 102. The data center cooling fluid (now cooled) is then supplied to an intake of the ventilation system of data center 103 to cool the computer servers.

In embodiments that utilize the advantage of a nearby CHP plant 101, in the ORC mode, waste hot water from CHP plant 101 can be received via control valve 215 at heat exchange unit 211 and returned back to CHP plant 101 via control valve 213. At heat exchange unit 211 the working fluid can be further heated and then supplied to dual mode expander-compressor unit to complete the cycle. In one embodiment, where system 102 operates in the GCC mode, heat exchange unit 213 remains inoperable, and the working fluid is transported back to dual mode expander-compressor unit 201, as further described herein.

Figure 3:
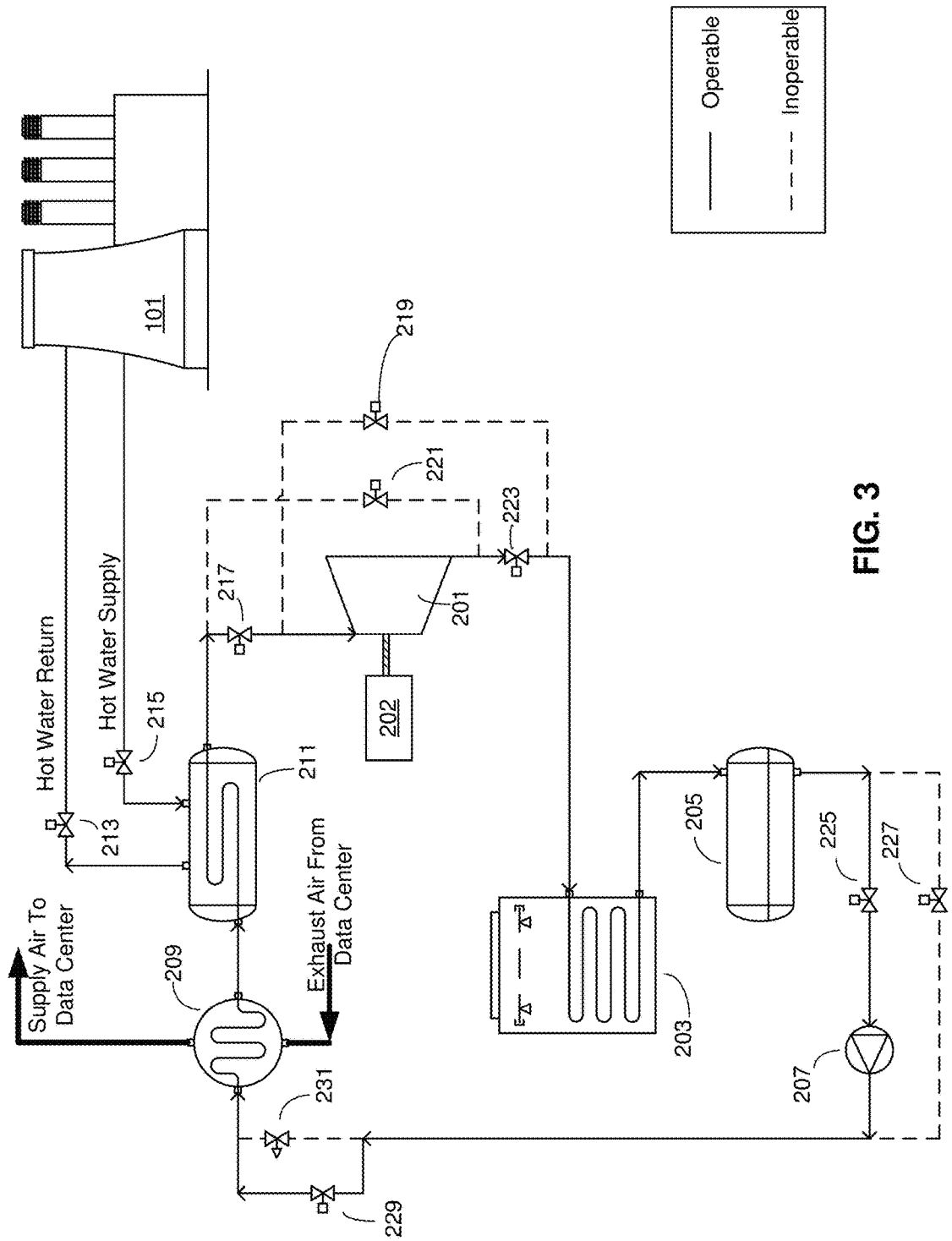
FIG. 3 illustrates a diagram of a system operating in an organic Rankine cycle, according to one embodiment of the present invention.

FIG. 3 illustrates a diagram of a system operating in an organic Rankine cycle, according to one embodiment of the present invention. For illustrative purposes, dashed lines indicate inoperable segments/portions, and solid lines indicate operable segments/portions, of a closed loop circulatory system or heat transfer system. The solid lines indicate a circulatory system through which working fluid flows to complete the cycle.

In the ORC mode, system 102 operates as a data center cooling system and optionally generates electricity, which can then be used to power one or more components of system 102, to implement efficient data center cooling techniques. In this embodiment, dual mode expander-compressor 201 operates as an expander/generator rotating a turbine to generate electricity. In one embodiment, dual mode expander-compressor unit 201 is a compressor that has been modified to operate in reverse, thus operating a compressor modified to operate as an expander.

Conventional systems running in an ORC mode have been used successfully for reclaiming heat from various sources, however the cost when compared to the amount of power generated typically makes it a poor investment. The ORC is conventionally deployed to exploit a thermal resource at temperatures below boiling temperature of water. Like all heat engines, the ORC operates in the thermodynamic framework of a Carnot cycle with a heat to work conversion efficiency proportional to the difference between the temperatures of heat injection and rejection. Because ambient air generally sets the rejection temperature, Carnot cycle efficiencies usually scale with the temperature of heat injection, according to formula:

$$\eta_{Carnot} = 1 - \frac{Tc}{Th}$$

where Tc is the absolute temperature of the cold reservoir and Th is the absolute temperature of the hot reservoir, and the efficiency η is the ratio of the work done by the ORC to the heat drawn out of the hot reservoir. In practice, however, measurements of operating heat engines conform to a Chambadal-Novikov (also known as Curzon-Ahlborn) efficiency derived version accounting for finite heat transfer is:

$$\eta_{Chambadal-Novikov} = 1 - \sqrt{\frac{T2}{T1}}$$

where T2 is the temperature of the heat sink, and T1 is the temperature of the heat source, and the efficiency η is the ratio of the work done by the ORC to the heat drawn out of the hot reservoir.

For a data center, the temperature of the air entering the computer servers is typically allowed to be within an operable range of the electronic equipment which can be as high as 90 degrees Fahrenheit. The temperature of a containment area from where waste heated air is released out of the can allowed to reach approximately 110 degrees Fahrenheit. Using various experiments, the inventors have discovered an efficiency gain to range from 5% to 35%, depending on cooling requirements, available heat, and ambient conditions from conventional data center cooling systems. Therefore, given the operating conditions of a data center and/or power plant, in one embodiment, an ORC with net positive power output can be achieved.

An ORC generally includes expander unit 201, boiler unit 209, condenser unit 203, and pump unit 207. In various embodiment, many different types of compressors, known to a person of ordinary skill in the art, can be used in reverse to operate the compressor as an expander; such modified units are also referred to as dual mode expander-compressor unit 201, herein. However, due to the pressure ratios involved between compression and expansion, in a preferred mode, the invention utilizes a scroll compressor as a dual mode expander-compressor unit 201, which has suitable characteristics to operate as both a compressor and an expander. Further, in one embodiment, Tetrafluoroethane, or R-134a, can be used as the working fluid. Alternate fluids or mixtures, as known to a person of ordinary skill in the art, with the potential for trans-critical or supercritical cycles can also be used as the working fluid, which can push the ORC efficiency of system 102 towards a Chambadal-Novikov/Curzon-Albhorn threshold.

The working fluid received at dual mode expander-compressor 201 via control valve 217 can be in a hot gaseous state or phase, at a relatively higher pressure from elsewhere in the closed loop circulatory system. In the ORC mode, dual mode expander-compressor 201 rotates DC motor 202 backwards, thus converting mechanical energy into electricity. The hot working fluid (in a gaseous phase) can rotate a turbine/expander to convert the thermodynamic energy into electricity, expanding the working fluid received from control valve 217. Thereafter, the working fluid exits dual mode expander-compressor 201 via control valve 223 and is transported to condenser 203. The working fluid is condensed in condenser 203 by transferring heat to a cold thermal reservoir and is then received by receiver 205. At this stage, the working fluid is in a liquid state with a relatively lowest pressure of the closed loop circulatory system.

Thereafter, via control valve 225, the liquid working fluid is transported to pump 207 where it is pressurized. The closed loop circulatory system of system 102 then transports the cooled working-fluid to boiler unit 209 via control valve 229. At boiler unit 209, the high pressure liquid working fluid receives thermal energy from the data center cooling (hot) fluid/air from an outlet channel of ventilation subsystem of datacenter 103. Due to the thermal energy received at boiler unit 209, the high pressure working fluid changes to a gaseous phase, thereby cooling the data center cooling fluid received from the ventilation subsystem of data center 103. The cooled data center cooling fluid can then be supplied to an inlet channel of the ventilation subsystem to cool the computer server equipment of data center 103. The high pressure working fluid is then transported to the expander/generator to complete the cycle.

In embodiments that utilize the advantage of a nearby CHP plant 101 waste hot water (or other coolant) from CHP plant 101 can be received via control valve 215 at heat exchange unit 211 and returned back to CHP plant 101 via control valve 213. At heat exchange unit 211 the working fluid (currently in a high pressure gaseous phase) can be further (super) heated to be supplied to dual mode expander-compressor unit 201 to complete the cycle. Since the hotter the working fluid, the higher its pressure (and thereby accumulating more energy), more electricity can be generated at the expander/generator to provide power to either the data center or any of the various components used by system 102 that need electricity to operate (e.g., pump 207). In one embodiment, generated electricity, or a portion thereof, can be saved to a battery system of data center 103. In another embodiment, generated electricity, or a portion thereof, can be supplied to power grid 104. Thus, in the ORC mode an efficient data center cooling system can be implemented reusing wasted thermal energy from one or more heat sources.

Figure 4:
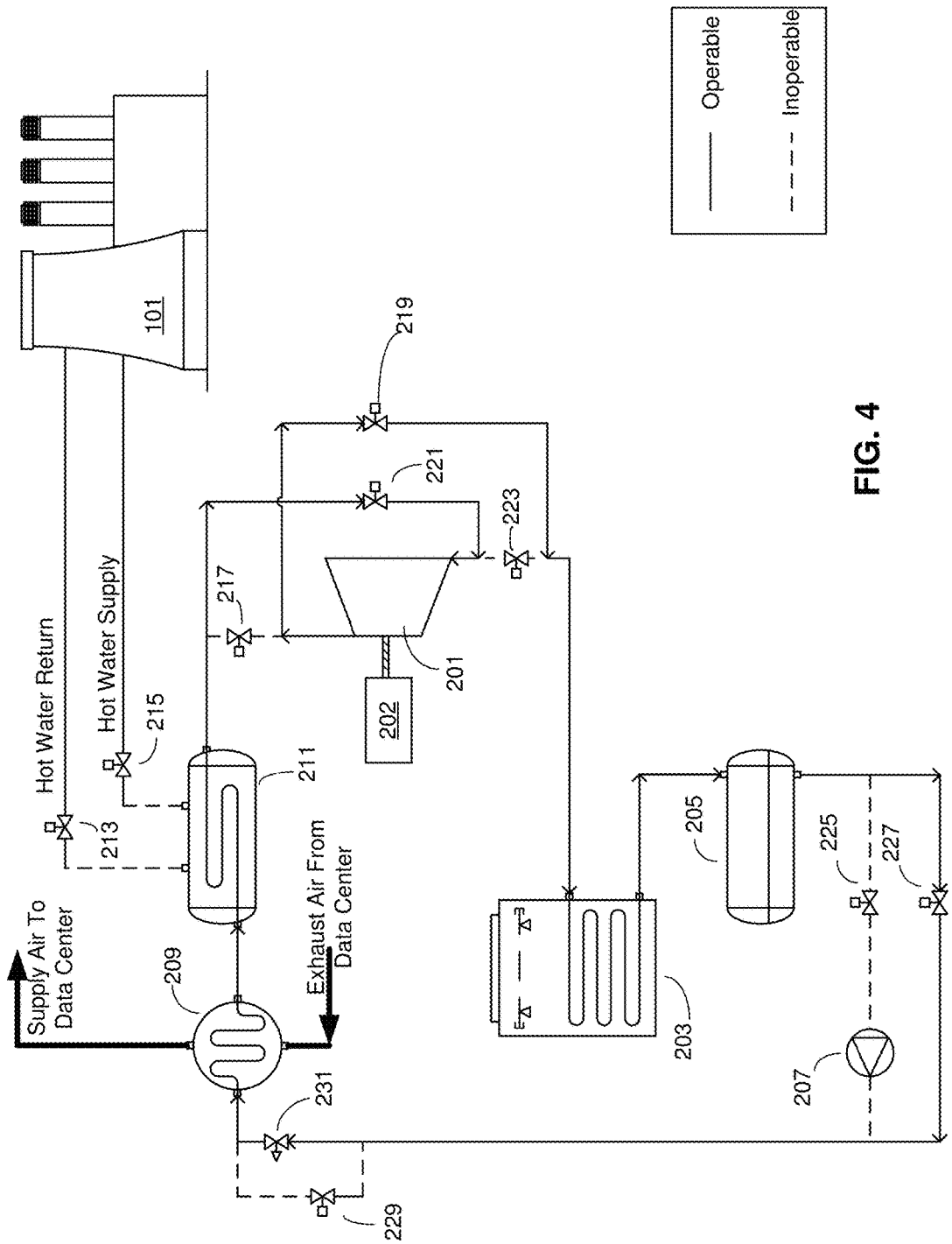
FIG. 4 illustrates a diagram of a system operating in a gas compression cycle, according to one embodiment of the present invention.

FIG. 4 illustrates a diagram of a system operating in a gas compression cycle, according to one embodiment of the present invention. For illustrative purposes, dashed lines indicate inoperable segments/portions, and solid lines indicate operable segments/portions, of a closed loop circulatory system or heat transfer system. The solid lines indicate a circulatory system through which working fluid can be circulated to complete the GCC. In this mode, system 102 operates as a conventional refrigeration/Heating, ventilation and air conditioning (HVAC) system to cool data center 103. The main components of this system are a dual mode expander-compressor 201 unit operable as a refrigeration compressor, an evaporator or boiling unit 209, and a condenser unit 203. In the GCC mode, system 102 operates a closed loop refrigeration cycle where a refrigerant is used as the working fluid.

In this embodiment, the working fluid, in a gaseous phase, is received by dual mode expander-compressor unit 201 via control valve 221. In this embodiment, direct current (DC) motor 202 consumes power from the power grid 104 to operate dual mode expander-compressor unit 201 as a compressor. The compressed (high pressure) working fluid is then transported to condenser unit 203 via control valve 219 where it is cooled and condensed to a liquid state and stored at receiver 205. Thereafter, passing through control valve 227, the high pressure working fluid liquid moves through expansion/modulation valve 231, which is a pressure and temperature reducing device. After the temperature and pressure of the working fluid is reduced, the working fluid is introduced to the boiler unit 209 where waste heat from the data center cooling fluid at the outlet channel of the ventilation system of data center 103 is removed. The heated working fluid transforms to a gaseous phase, cooling the data center cooling fluid of the ventilation system which is cycled back into an inlet channel of the ventilation system. In this mode, heat exchange unit 211 is inoperable, and the gaseous working fluid is introduced to compressor 201 via control valve 221, and the cycle is repeated until suitable ambient conditions are achieved to run the ORC mode.

The invention described herein provides a novel approach using which a conventional data center cooling system can be modified to operate in an ORC mode as described herein to cool the data center as well as generate electricity. Overlaying a traditional refrigeration cycle and the ORC, the invention enables the improvement of both cycles. Thus, in one embodiment, compressor 201 and motor 202 can be reversed as expander and generator. On warm days, the traditional refrigeration cycle can operate to cool the data center and on cooler days the ORC can operate to cool the data center and generating electricity. In one embodiment, the power generated by the ORC can be circuited back to provide power to the computer servers of data center 103 or any of the various components of system 102.

Figure 5:
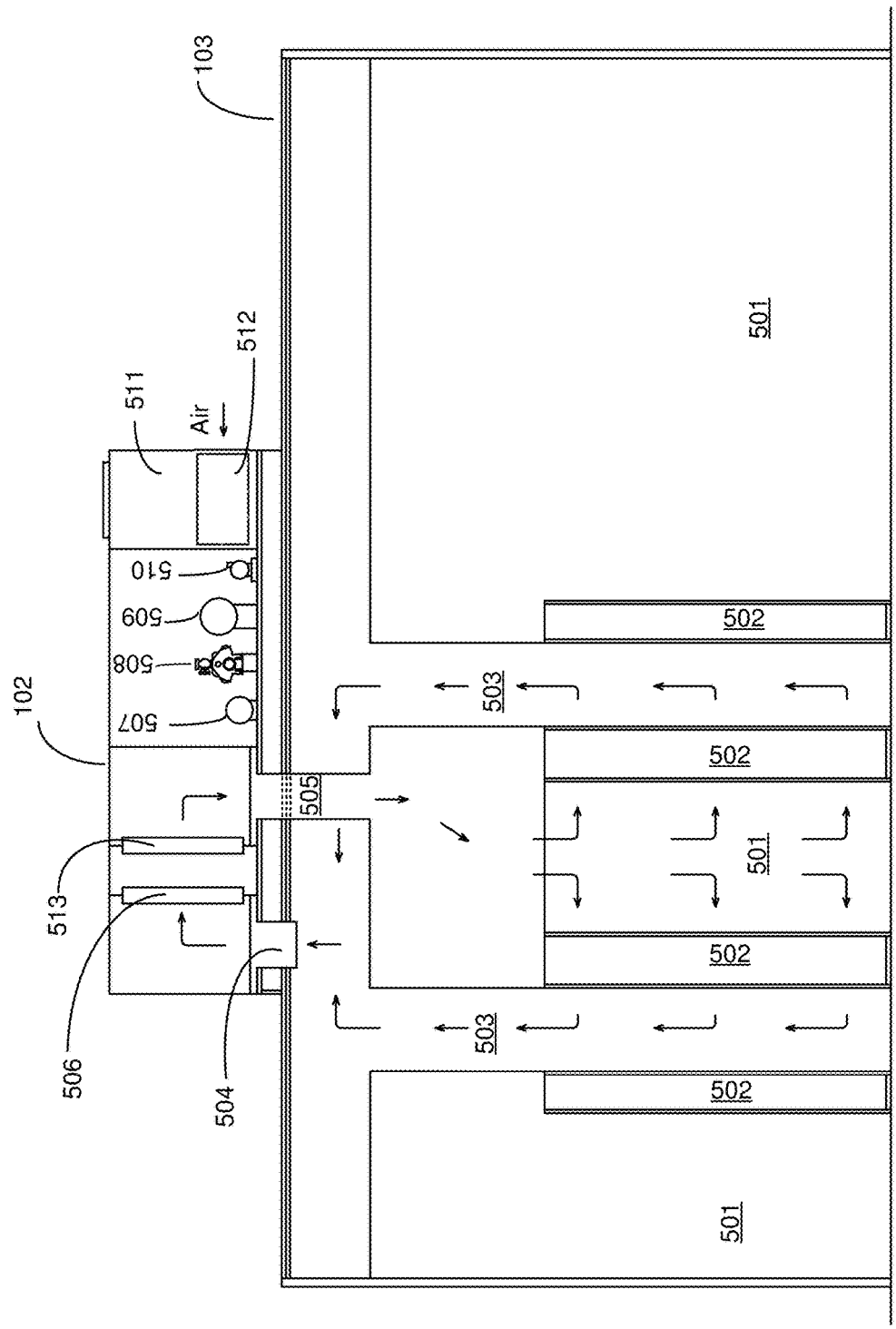
FIG. 5 illustrates a diagram of a computer data center implementing an embodiment of the system of the present invention.

FIG. 5 illustrates a diagram of a ventilation system 500 computer data center implementing an embodiment of the system of the present invention. In recent years, data center operators have pushed the limits of computer servers in terms of temperatures they can withstand, operating the data centers at higher temperatures, thus requiring less energy for cooling. Typically, air to cool the computer server enters the computer server on one side and exits from the opposite. In order to improve cooling efficiency, a Hot Aisle Containment (HAC) can be implemented, in one embodiment, to separate the cooler supply air from the hot air exiting the computer servers.

As illustrated, system 102 can be coupled to datacenter 103. To make data center 103 efficient, in one embodiment, cool supply air streams from channel 505 to computer server racks 502 in server room/chamber 501 and hot discharge air streams from containment area 503, physically separating chamber 501 and containment area 503. The hot discharge is provided from the outlet of ventilation system 500 is provided to boiler unit 506 via channel 504. Separating the air allows efficient cooling of data center 103 by traditional cooling systems. Separating the air also creates an air stream that is sufficiently hot to heat the working fluid to a superheated gas capable of rotating the expander and generator of an ORC. Containment of the hot air exhausting from the servers 502 is often achieved by constructing plastic or metal barriers between chamber 501 and containment area 503.

As illustrated, wasted heat discharge from containment area 503 is received, via channel 504 at boiler unit 516 and heat is removed from the data center ventilation fluid/air, heating working fluid within boiler unit 506, and the data center cooled fluid/air is transported to channel 505 via fan 513. From boiler unit 506, working fluid is optionally receive at heat exchanger 507, where it is super-heated only during the ORC mode, as described in FIG. 3. The working fluid is then transported to dual mode expander-compressor unit 508, where either electricity is generated when dual mode expander-compressor unit 508 is operated as an expander, or consume electricity from the grid operating a conventional refrigeration cycle when dual mode expander-compressor unit 508 is operated as a compressor. Working fluid is then transported to condenser 511 where it is cooled and exposed to a cold reservoir via chamber 512. Working fluid is then transported to receiver 509 and then depending on the mode, either pressurized at pump unit 510 or transported directly to boiler 506.

Figure 6:
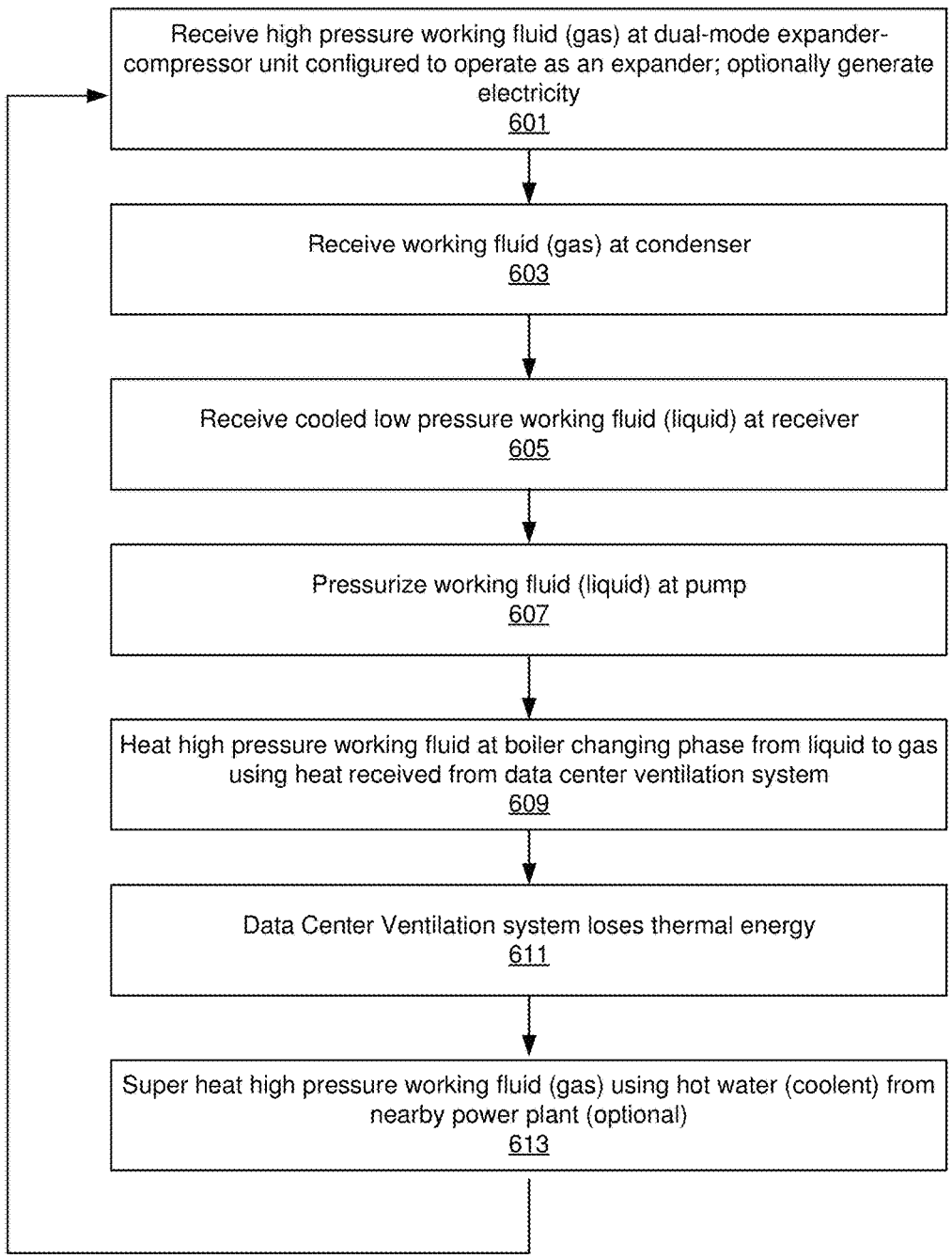
FIG. 6 illustrates a flow diagram of the interaction of various components of a system operating in the ORC mode, according to one embodiment of the present invention.

FIG. 6 illustrates a flow diagram of the interaction of various components of a system operating in the ORC mode, according to one embodiment of the present invention. As illustrated at 601 cooling system 102 receives high pressure working fluid in a gaseous phase at dual-mode expander-compressor unit. Optionally, when the pressure of the working-fluid is high enough to efficiently rotate a DC generator, cooling system 102 can generate electricity. At 603, working fluid is received at condenser unit where it is cooled and transformed to a liquid state, and at 605 transported to receiver. At 607 working fluid is pressurized at circulating pump unit and at 609, the working fluid is heated at the boiler unit changing phase from liquid to gas, thereby increasing pressure of working fluid. At 611 the data center cooling fluid loses thermal energy which in turn is supplied to the inlet of the data center ventilation system. At 613, optionally, the gaseous working fluid is super-heated using hot, waste coolant from another source (e.g., power plant), and the cycle is repeated.

Figure 7:
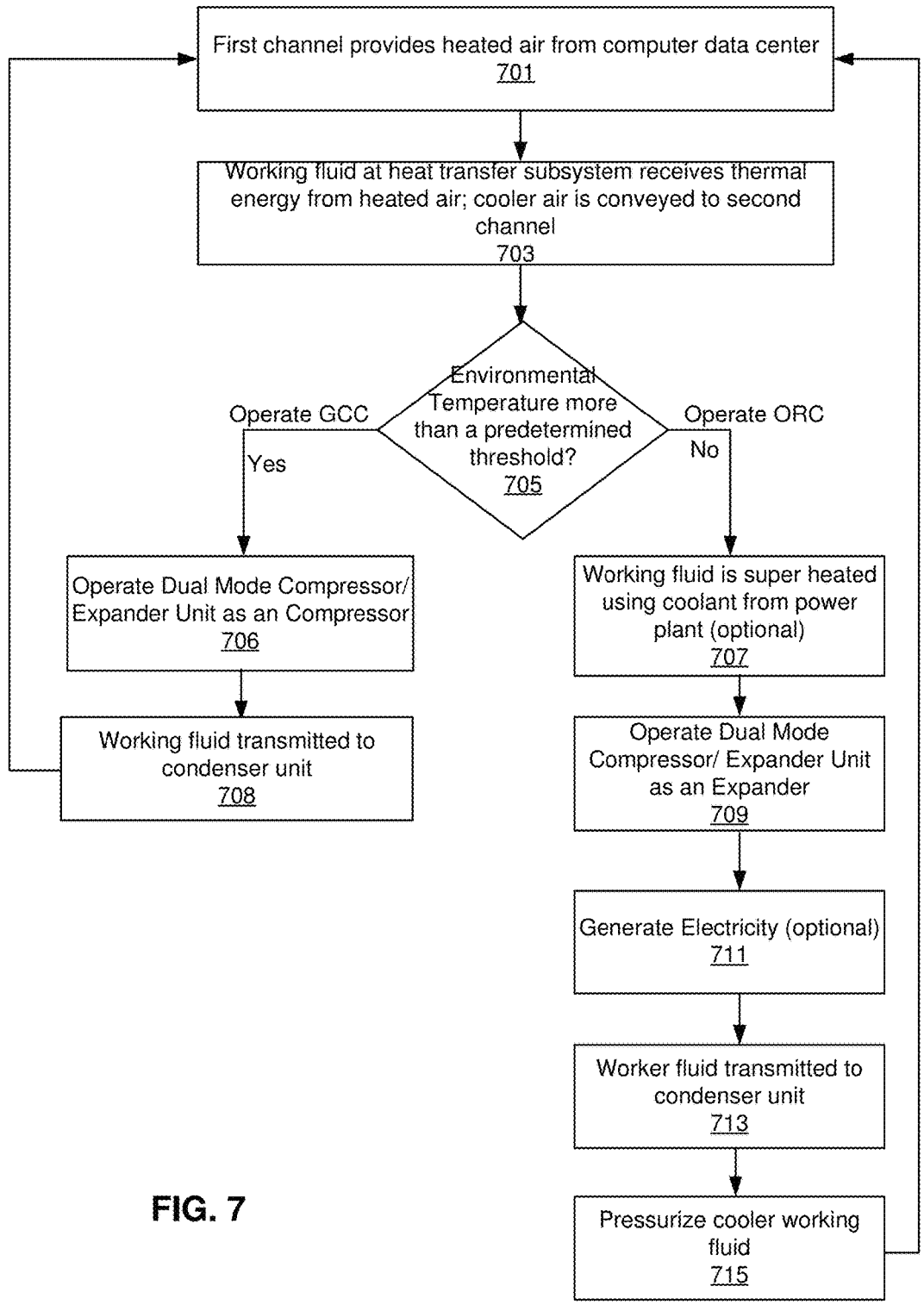
FIG. 7 illustrates a flow diagram of a heat exchange unit or closed loop circulation subsystem of the system implemented according to one embodiment of the present invention.

FIG. 7 illustrates a flow diagram of a heat exchange unit or closed loop circulation subsystem of the system implemented according to one embodiment of the present invention. As illustrated, at 701 a first channel is configured to convey a data center cooling fluid (e.g., air, water, etc.) received from an outlet of a ventilation system of the computer data center at a first temperature. At 703, working fluid at heat transfer subsystem receives thermal energy from the data center cooling fluid, and the data center cooling fluid is conveyed to a second channel configured to provide an inlet of the ventilation system of the data center to cool the computer data center at a second temperature, with the first temperature is higher than the second temperature. At 705, ambient/environmental conditions are determined to determine the mode in which the system would operate efficiently. For example, in one embodiment, the outside environment temperature effecting the temperature of the working fluid at the condenser is determined. If the temperature is above a threshold temperature, the system operates in the GCC (conventional refrigeration cycle), thereby expending energy by operating the dual mode expander-compressor unit as a compressor, at 706. At 708, the working fluid is transmitted to the condenser unit, and the cycle is repeated. If however, at 705, it is determined that ambient conditions are optimal to operate the system in the ORC mode (e.g., the outside temperature is below a predetermined threshold), at 707, working fluid can optionally be heated by thermal energy provided by another source (e.g., power plant), and at 709, the dual mode expander-compressor unit is operated as an expander. At 711, optionally electricity is generated (and stored or reused by the data center), and at 713, working fluid is transmitted to condenser unit 713. At 715, the cooled working fluid is pressurized and the cycle is repeated.

Figure 8:
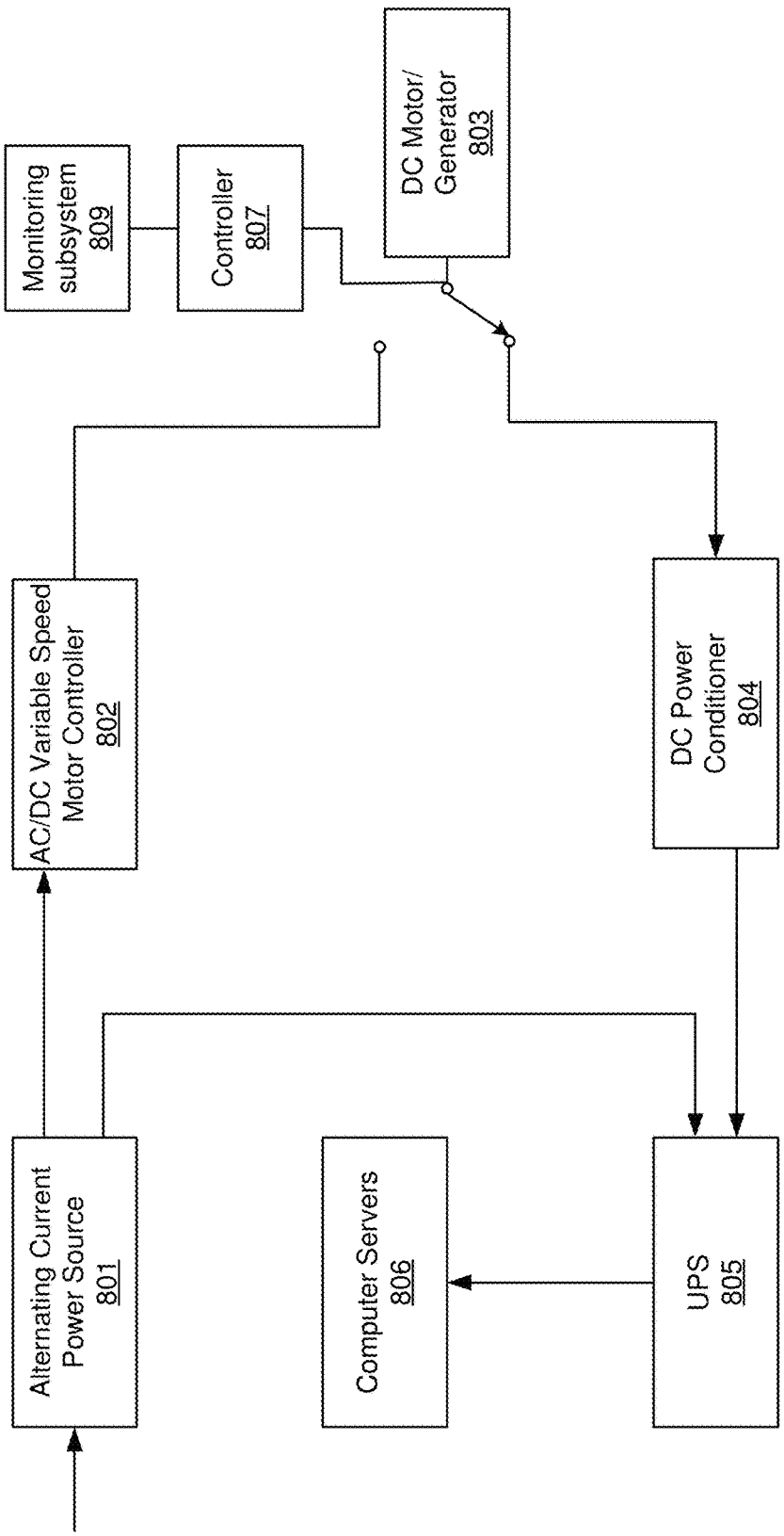
FIG. 8 illustrates a block diagram of a system implementing the selection of a gas compression cycle and an organic Rankine cycle generating electricity, according to one embodiment of the present invention.

FIG. 8 illustrates a block diagram of a system implementing the selection of a gas compression cycle and an organic Rankine cycle generating electricity, according to one embodiment of the present invention. In the GCC mode, alternating current (AC) power source 801 of system 102 is provided as an input to AC/DC variable speed controller 802. AC/DC variable speed controller 802 can operate DC motor 803 that is coupled to a compressor unit to provide cooling to computer servers 806.

Data centers typically require the use of Uninterruptable Power Supplies (UPS) that utilize direct current (DC) batteries to source power to the computer servers. In one embodiment, the DC power generated by the ORC is provided to these batteries, enabling its reuse on-site. Power supply to the computer servers in a data center is critical. Most data centers utilize a UPS system with battery backup. These batteries power to the servers in the event of a power loss. Backup power systems, such as diesel generators, will start up and take over providing power to the servers via the UPS. Once utility power is restored, the generators will stop, and the utility power will take over. Direct Current (DC) batteries are typically used as part of the UPS system In the ORC mode, DC generator 803 is rotated to generate electricity. The electricity generated varies in voltage, due to ambient conditions, and is run through DC power conditioner 804 before being provided to DC batteries, which can be part of a UPS system 805 providing uninterrupted power to the computer servers 806. Alternatively, generated electricity may be circuited back to power grid 104. To operate in the ORC mode, in one embodiment, scroll compressors and associated motors can be provided to compress the working fluid gas and generate electricity. In one embodiment, a scroll compressor is modified to allow its compressor and associated motor to be used in reverse, as an expander-generator, also referred to as dual mode expander-compressor unit herein.

In one embodiment, system 102 can include monitoring subsystem 809 that includes sensors to monitor the temperature, pressure, or flow of the working-fluid, which can change due to ambient/environmental conditions. Such sensors of the sensor monitoring subsystem can be place at one or more locations within the closed loop circulation subsystem of system 102. Monitoring subsystem 809 can transmit sensor data to controller 807. In one embodiment, controller subsystem 807 controls operation of the system based on the sensor data to determine the mode of operation of the system. For example, in one embodiment, if it is determined that the outside environmental temperature is above a predetermined temperature (e.g., 75 degrees Fahrenheit), and thus determine that the working fluid will not be able to be cooled enough at the condenser unit to efficiently remove heat from the data center cooling fluid at the boiler unit, controller 807 can determine to operate cooling system 102 in GCC mode. However, when ambient conditions result in the outside environmental temperature being below the threshold temperature, controller 807 can switch cooling system 102 to operate in the ORC mode, thereby providing an efficient cooling system that can recover and reuse thermal energy from the data center and/or another thermal energy source (e.g., power plant). Thus, the controller subsystem 807, in one embodiment, based on sensor data, can determine whether to run the ORC mode or GCC mode.

Figure 9:
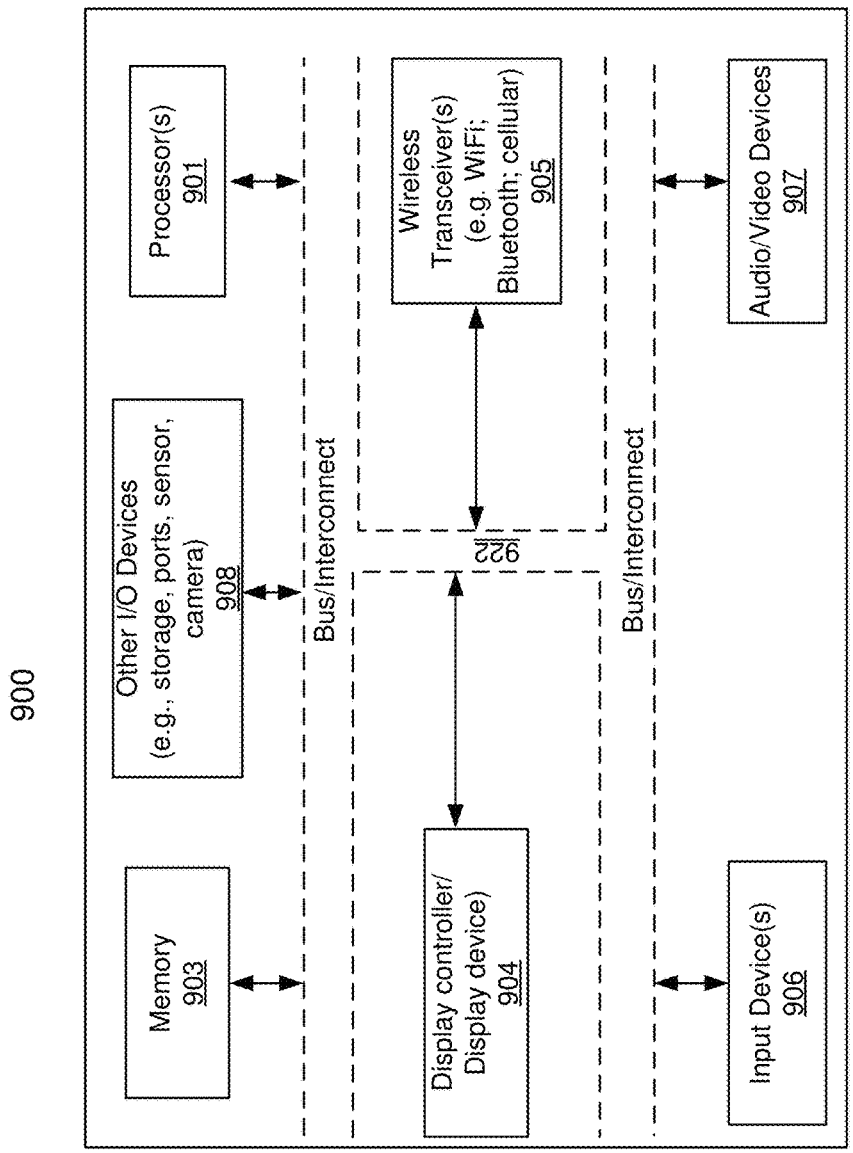
FIG. 9 is a block diagram illustrating a data processing system such as a computing system which may be used with one embodiment of the invention.

FIG. 9 is a block diagram illustrating a data processing system such as a computing system 900 which may be used with one embodiment of the invention. For example, system 900 can be implemented as part of a controller to determine the cycle (organic Rankine cycle or gas compression cycle) used by the heat transferring subsystem or the closed loop circulation subsystem. It should be apparent from this description that aspects of the present invention can be embodied, at least in part, in software. That is, the techniques may be carried out in a computer system or other computer system in response to its processor, such as a microprocessor, executing sequences of instructions contained in memory, such as a ROM, DRAM, mass storage, or a remote storage device. In various embodiments, hardware circuitry may be used in combination with software instructions to implement the present invention. Thus, the techniques are not limited to any specific combination of hardware circuitry and software nor to any particular source for the instructions executed by the computer system. In addition, throughout this description, various functions and operations are described as being performed by or caused by software code to simplify description. However, those skilled in the art will recognize what is meant by such expressions is that the functions result from execution of the code by a processor.

In one embodiment, system 900 can represent the controller 807. System 900 can have a distributed architecture having a plurality of nodes coupled through a network, or all of its components may be integrated into a single unit. Computing system 900 can represent any of the data processing systems described above performing any of the processes or methods described above. In one embodiment, computer system 900 can be implemented as integrated circuits (ICs), discrete electronic devices, modules adapted to a circuit board such as a motherboard, an add-in card of the computer system, and/or as components that can be incorporated within a chassis/case of any computing device. System 900 is intended to show a high level view of many components of any data processing unit or computer system. However, it is to be understood that additional or fewer components may be present in certain implementations and furthermore, different arrangement of the components shown may occur in other implementations. System 900 can represent a desktop, a laptop, a tablet, a server, a mobile phone, a programmable logic controller, a personal digital assistant (PDA), a personal communicator, a network router or hub, a wireless access point (AP) or repeater, a set-top box, or a combination thereof.

In one embodiment, system 900 includes processor 901, memory 903, and devices 905-908 via a bus or an interconnect 922. Processor 901 can represent a single processor or multiple processors with a single processor core or multiple processor cores included therein. Processor 901 can represent one or more general-purpose processors such as a microprocessor, a central processing unit (CPU), Micro Controller Unit (MCU), etc. Processor 901 can be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 901 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions. Processor 901, can also be a low power multi-core processor socket such as an ultra low voltage processor, may act as a main processing unit and central hub for communication with the various components of the system. Such processor can be implemented as a system on chip (SoC).

Processor 901 is configured to execute instructions for performing the operations and methods discussed herein. System 900 further includes a graphics interface that communicates with graphics subsystem 904, which may include a display controller and/or a display device. Processor 901 can communicate with memory 903, which in an embodiment can be implemented via multiple memory devices to provide for a given amount of system memory. In various implementations the individual memory devices can be of different package types such as single die package (SDP), dual die package (DDP) or quad die package (QDP). These devices can in some embodiments be directly soldered onto a motherboard to provide a lower profile solution, while in other embodiments the devices can be configured as one or more memory modules that in turn can couple to the motherboard by a given connector. Memory 903 can be a machine readable non-transitory storage medium such as one or more volatile storage (or memory) devices such as random access memory (RAM), dynamic RAM (DRAM), synchronous DRAM (SDRAM), static RAM (SRAM), or other types of storage devices such as hard drives and flash memory. Memory 903 may store information including sequences of executable program instructions that are executed by processor 901, or any other device. System 900 can further include IO devices such as devices 905-908, including wireless transceiver(s) 905, input device(s) 906, audio IO device(s) 907, and other IO devices 908.

Wireless transceiver 905 can be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, network interfaces (e.g., Ethernet interfaces) or a combination thereof. Input device(s) 906 can include a mouse, a touch pad, a touch sensitive screen (which may be integrated with display device 904), a pointer device such as a stylus, and/or a keyboard (e.g., physical keyboard or a virtual keyboard displayed as part of a touch sensitive screen). Other optional devices 908 can include a storage device (e.g., a hard drive, a flash memory device), universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. Optional devices 908 can further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors can be coupled to interconnect 922 via a sensor hub (not shown), while other devices such as a keyboard or thermal sensor may be controlled by an embedded controller (not shown), dependent upon the specific configuration or design of system 900.

To provide for persistent storage of information such as data, applications, one or more operating systems and so forth, in one embodiment, a mass storage (not shown) may also couple to processor 901. In various embodiments, to enable a thinner and lighter system design as well as to improve system responsiveness, this mass storage may be implemented via a solid state device (SSD). However in other embodiments, the mass storage may primarily be implemented using a hard disk drive (HDD) with a smaller amount of SSD storage to act as a SSD cache to enable non-volatile storage of context state and other such information during power down events so that a fast power up can occur on RE-initiation of system activities. Also a flash device may be coupled to processor 901, e.g., via a serial peripheral interface (SPI). This flash device may provide for non-volatile storage of system software, including a basic input/output software (BIOS) as well as other firmware of the system.

Note that while system 900 is illustrated with various components of a data processing system, it is not intended to represent any particular architecture or manner of interconnecting the components; as such details are not germane to embodiments of the present invention. It will also be appreciated that network computers, handheld computers, mobile phones, and other data processing systems which have fewer components or perhaps more components may also be used with embodiments of the invention.

Thus, methods, apparatuses, systems, and computer readable medium to cool a computer data center and optionally generate electricity using recovered thermal energy are described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A system for utilizing recovered thermal energy, comprising:
   a computer data center, wherein the computer data center emits a cooling fluid from an outlet of a ventilation system coupled to the computer data center, the cooling fluid transmitted at a first temperature;
   a first channel, coupled to the outlet of the ventilation system, wherein the first channel is configured to convey the cooling fluid;
   a second channel, coupled to an inlet of the ventilation system, wherein the second channel is configured to convey the cooling fluid at a second temperature, the cooling fluid provided into the inlet of the ventilation system of the computer data center, and wherein the second temperature is lower than the first temperature;
   a closed loop circulation subsystem (CLCS) includes a dual mode expander-compressor unit, wherein the CLCS is configured to operate in at least one of an organic Rankine cycle (ORC) mode or a gas compression cycle (GCC) mode, and wherein the CLCS operates as an expander when the dual mode expander-compressor unit operates in the ORC mode, and wherein the CLCS operates as a compressor when the dual mode expander-compressor unit operates in the GCC mode, wherein a working-fluid within the CLCS is heated in the ORC mode by the cooling fluid from the first channel, thereby changing temperature of the cooling fluid from the first temperature to the second temperature, the CLCS coupled to the first and second channels;
   a monitoring subsystem, comprising sensors to monitor at least one of a temperature, pressure, or flow of the working-fluid within the CLCS, the monitoring subsystem providing sensor data related to the at least one of temperature, pressure, or flow of the working-fluid; and
   a controller subsystem coupled to the monitoring subsystem, the controller subsystem receiving sensor data from the monitoring subsystem;
   wherein at least a portion of thermal energy received from the computer data center through the first channel is transformed and reused to cool the computer data center through the second channel.

2. The system of claim 1, wherein the CLCS further comprises a heat exchanger unit, the heat exchanger unit coupled to a third channel, wherein the third channel conveys a fluid having a third temperature from another source, the third temperature higher than the first and second temperatures, and wherein the heat exchanger unit is operable when the CLCS operates in the ORC mode.

3. The system of claim 1, wherein the CLCS further comprises at least one of a condenser unit, a receiver unit, a circulating pump unit, or an evaporator unit, and wherein the controller subsystem, based on sensor data can determine whether to operate the ORC mode or GCC mode.

4. The system of claim 3, wherein the circulating pump unit is inoperable when the CLCS operates in the GCC mode.

5. The system of claim 1, wherein the working-fluid interacts with the CLCS, operating in the ORC mode, to generate electricity.

6. The system of claim 1, wherein the working-fluid is organic substance with a high molecular mass.

7. The system of claim 1, wherein the cooling fluid is one of air, water, or an organic substance.

8. A computer data center cooling system, comprising:
   a computer data center, comprising a ventilation system;
   a first channel, coupled to the ventilation system of the computer data center, wherein the first channel conveys a cooling fluid from the ventilation system of the computer data center at a first temperature, the cooling fluid received from an outlet of the ventilation system of the computer data center;
   a second channel, coupled to the ventilation system of the computer data center, wherein the second channel conveys the cooling fluid to the computer data center at a second temperature, the cooling fluid transmitted into an inlet of the ventilation system of the computer data center to cool the computer data center, wherein the first temperature is higher than the second temperature;
   a heat transfer subsystem, coupled to the first and second channel, operating in an organic Rankine cycle (ORC) mode wherein the heat transfer subsystem changes temperature of the cooling fluid from the first temperature to the second temperature, wherein the heat transfer subsystem is coupled to a third channel, the third channel conveying a fluid having a third temperature from another source, the third temperature higher than the first and second temperatures, and wherein the third temperature increase the temperature of the cooling fluid, and wherein the heat transfer subsystem comprises a dual mode expander-compressor unit, and wherein the heat transfer subsystem can be configured to operate in a gas compression cycle (GCC) mode, and wherein the dual mode expander-compressor unit operates as an expander when the heat transfer subsystem operates in the ORC mode, and wherein the dual mode expander-compressor unit operates as a compressor when the heat transfer subsystem operates in the GCC mode;

a monitoring subsystem, comprising sensors to monitor at least one of a temperature, pressure, or flow of a working-fluid of the heat transfer subsystem, the monitoring subsystem providing sensor data related to the at least one of temperature, pressure, or flow of the working-fluid; and a controller subsystem coupled to the monitoring subsystem, the controller subsystem receiving sensor data from the monitoring subsystem, the controller subsystem determines whether to operate the heat transfer subsystem in the ORC mode or GCC mode.

9. The computer data center cooling system of claim 8, wherein the third channel is coupled to the heat transfer subsystem using a heat exchanger unit.

10. The computer data center cooling system of claim 8, wherein the heat transfer subsystem simultaneously generates electricity while cooling the computer data center.

11. The computer data center cooling system of claim 8, wherein when operating the GCC mode, the computer data center cooling system consumes electricity from a power grid to change temperature of the cooling fluid from the first temperature to the second temperature.

12. The computer data center cooling system of claim 8, wherein the heat transfer subsystem includes at least one of a condenser unit, a receiver unit, a circulating pump unit, or an evaporator unit, wherein the cooling fluid within the heat transfer subsystem is heated by the cooling fluid from the first channel at the evaporator unit, thereby changing temperature of the cooling fluid from the first temperature to the second temperature.

13. The computer data center cooling system of claim 12, wherein the heat transfer subsystem is coupled to the first and second channels via the evaporator unit.

14. The computer data center cooling system of claim 8, wherein the cooling fluid is organic substance with a high molecular mass.

15. The computer data center cooling system of claim 8, wherein the cooling fluid is air.

16. The computer data center cooling system of claim 8, wherein the cooling fluid is one of water, an organic substance, or a combination thereof.

* * * * *